(12) United States Patent
Park et al.

(10) Patent No.: US 12,438,134 B2
(45) Date of Patent: Oct. 7, 2025

(54) PACKAGE SUBSTRATE AND SEMICONDUCTOR PACKAGE INCLUDING THE SAME

(71) Applicant: Samsung Electronics Co., Ltd., Suwon-si (KR)

(72) Inventors: Junwoo Park, Anyang-si (KR); Sangsoo Kim, Cheonan-si (KR); Seunghwan Kim, Anyang-si (KR); Jungjoo Kim, Daegu (KR); Yongkwan Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 572 days.

(21) Appl. No.: 17/862,586

(22) Filed: Jul. 12, 2022

(65) Prior Publication Data

US 2023/0131730 A1 Apr. 27, 2023

(30) Foreign Application Priority Data

Oct. 27, 2021 (KR) .................. 10-2021-0144641

(51) Int. Cl.
*H01L 25/16* (2023.01)
*H01L 23/498* (2006.01)
(Continued)

(52) U.S. Cl.
CPC ........ *H01L 25/16* (2013.01); *H01L 23/49816* (2013.01); *H01L 23/49822* (2013.01);
(Continued)

(58) Field of Classification Search
CPC ............... H01L 25/16; H01L 23/49816; H01L 23/49822; H01L 23/49838; H01L 23/642;
(Continued)

(56) References Cited

U.S. PATENT DOCUMENTS 6,489,180 B1 12/2002 Tsai et al.
9,627,309 B2 4/2017 Kobayashi et al.
(Continued)

FOREIGN PATENT DOCUMENTS

KR 20150129440 A 11/2015
KR 1020200106001 A 9/2020

*Primary Examiner* — Jacob Y Choi
*Assistant Examiner* — Neil R Prasad
(74) *Attorney, Agent, or Firm* — Muir Patent Law, PLLC

(57) ABSTRACT

A semiconductor package includes a package substrate including a base substrate including a redistribution layer, pads disposed on first and second surfaces of the base substrate and connected to the redistribution layer, and a protective layer having a mounting region in which first openings respectively exposing first pads among the pads and a second opening exposing second pads among the pads and a portion of the second surface are disposed on the second surface; a semiconductor chip disposed on the mounting region and connected to the pads through the first openings and the second opening; and a sealing material covering a portion of the semiconductor chip and extending into the second opening. Four first openings among the first openings are respectively disposed adjacent to respective corners of the mounting region. The second opening is disposed to divide the four first openings into at least two groups.

20 Claims, 14 Drawing Sheets

(51) Int. Cl.
*H01L 23/64* (2006.01)
*H01L 23/00* (2006.01)

(52) U.S. Cl.
CPC ...... *H01L 23/49838* (2013.01); *H01L 23/642* (2013.01); *H01L 24/16* (2013.01); *H01L 24/32* (2013.01); *H01L 24/73* (2013.01); *H01L 25/162* (2013.01); *H01L 2224/16227* (2013.01); *H01L 2224/32225* (2013.01); *H01L 2224/73204* (2013.01); *H01L 2924/182* (2013.01); *H01L 2924/19041* (2013.01); *H01L 2924/19101* (2013.01)

(58) Field of Classification Search
CPC ......... H01L 24/16; H01L 24/32; H01L 24/73; H01L 25/162; H01L 2224/16227; H01L 2224/32225; H01L 2224/73204; H01L 2924/182; H01L 2924/19041; H01L 2924/19101
See application file for complete search history.

(56) References Cited

U.S. PATENT DOCUMENTS

| | | | |
|---|---|---|---|
| 9,842,788 B2 | 12/2017 | Chen et al. | |
| 10,410,885 B2 | 9/2019 | Darveaux | |
| 2011/0001233 A1* | 1/2011 | Iwase | H01L 24/32 257/737 |
| 2011/0248398 A1* | 10/2011 | Parvarandeh | H01L 24/11 257/737 |
| 2012/0083073 A1* | 4/2012 | Tanuma | H01L 23/49838 257/E21.505 |
| 2018/0061785 A1* | 3/2018 | Peyrot | H01L 23/642 |
| 2020/0105694 A1 | 4/2020 | Ko et al. | |
| 2020/0373268 A1* | 11/2020 | Kosuga | H01L 25/50 |
| 2021/0125886 A1 | 4/2021 | Wang et al. | |
| 2021/0125952 A1* | 4/2021 | Nayini | H01L 21/4853 |

* cited by examiner

PACKAGE SUBSTRATE AND SEMICONDUCTOR PACKAGE INCLUDING THE SAME

CROSS-REFERENCE TO RELATED APPLICATION(S)

This application claims benefit of priority to Korean Patent Application No. 10-2021-0144641 filed on Oct. 27, 2021 in the Korean Intellectual Property Office, the disclosure of which is incorporated herein by reference in its entirety.

BACKGROUND

The present inventive concept relates to a package substrate and a semiconductor package including the same.

In the case of a semiconductor package in which a high-performance semiconductor chip is embedded, problems such as malfunctions, performance degradation of a system, and the like, may occur due to voltage noise generated in a high-frequency band. Accordingly, there is a need to develop a package technology capable of improving power integrity (PI) characteristics of the semiconductor package by removing the voltage noise. To this end, a discrete component such as a passive device is being mounted on a rear surface of the semiconductor package. However, it is needed to prevent the passive device from being tilted or shifted while the passive device is mounted.

SUMMARY

An aspect of the present inventive concept is to provide a package substrate in which reliability of a mounted semiconductor chip is improved.

An aspect of the present inventive concept is to provide a semiconductor package having improved reliability of a semiconductor chip mounted on a package substrate.

According to an aspect of the present inventive concept, a semiconductor package is provided. The semiconductor package includes: a package substrate including a base substrate including a redistribution layer and having a front surface and a rear surface opposite to the front surface, front pads disposed on the front surface and electrically connected to the redistribution layer, rear pads disposed on the rear surface and electrically connected to the redistribution layer, the rear pads including first rear pads and second rear pads, a front protective layer including front openings respectively exposing the front pads on the front surface, and a rear protective layer including a mounting region in which first rear openings respectively exposing the first rear pads and a second rear opening exposing the second rear pads and a portion of the rear surface are disposed on the rear surface, a semiconductor chip disposed on the front protective layer and connected to the front pads, a passive device disposed on the mounting region of the rear protective layer and connected to the rear pads, connection bumps disposed on the rear surface adjacent to the passive device, and electrically connected to the redistribution layer, and a sealing material spaced apart from the connection bumps, covering a portion of the passive device, and extending into the second rear opening. Four first rear openings of the first rear openings are respectively disposed adjacent to each corner of the mounting region. The second rear opening is disposed to divide the four first rear openings into at least two groups.

According to an aspect of the present inventive concept, a semiconductor package, includes: a package substrate including a base substrate including a redistribution layer, a plurality of pads disposed on a first surface of the base substrate and electrically connected to the redistribution layer, and a protective layer having a mounting region in which first openings respectively exposing first pads among the plurality of pads and a second opening exposing second pads among the plurality of pads and a portion of the first surface are disposed on the first surface of the base substrate, a passive device disposed on the mounting region of the protective layer and electrically connected to the plurality of pads through the first openings and the second opening, and a sealing material covering a portion of the passive device and extending into the second opening. Four first openings among the first openings are respectively disposed adjacent to respective corners of the mounting region. The second opening is disposed to divide the four first openings into at least two groups.

According to an aspect of the present inventive concept, a package substrate is provided. The package substrate includes: a base substrate including a plurality of insulating layers and redistribution layers disposed in the plurality of insulating layers, and having a front surface and a rear surface opposite to the front surface, front pads disposed on the front surface and electrically connected to the redistribution layers, rear pads disposed on the rear surface and electrically connected to the redistribution layers, a front protective layer having front openings respectively exposing the front pads on the front surface, and a rear protective layer having a mounting region in which first rear openings respectively exposing first rear pads among the rear pads and a second rear opening exposing second rear pads among the rear pads and a portion of the rear surface are disposed on the rear surface. Four rear openings among the first rear openings are respectively disposed adjacent to each corner of the mounting region. The second rear opening is disposed to divide the four rear openings into at least two groups.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
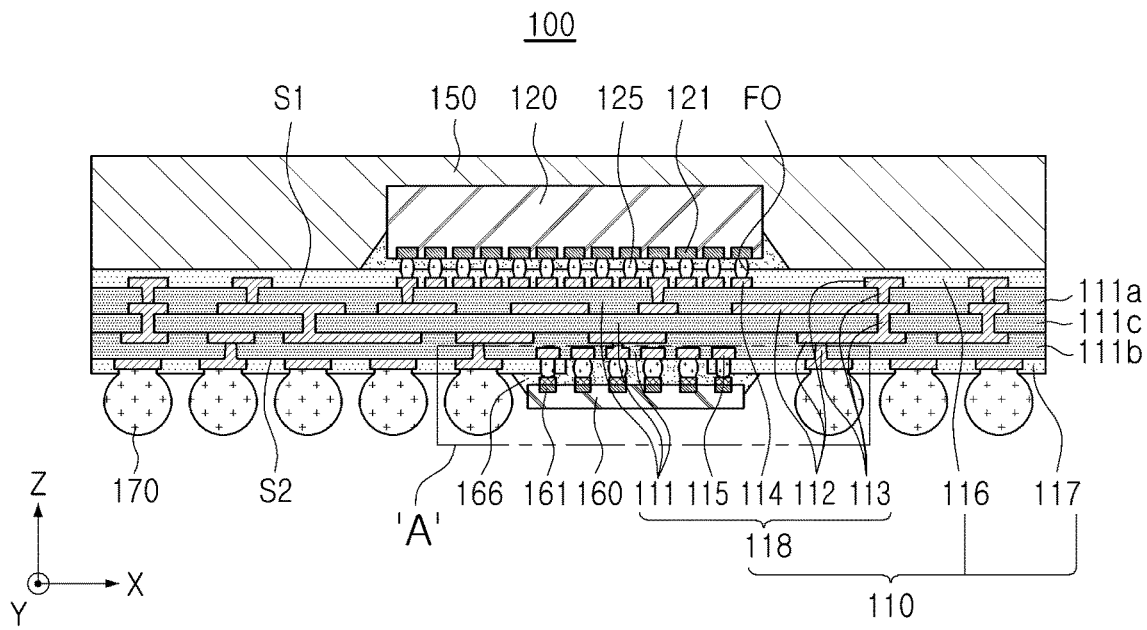
FIG. 1 is a cross-sectional view illustrating a semiconductor package according to an example embodiment of the present inventive concept.
Figure 2:
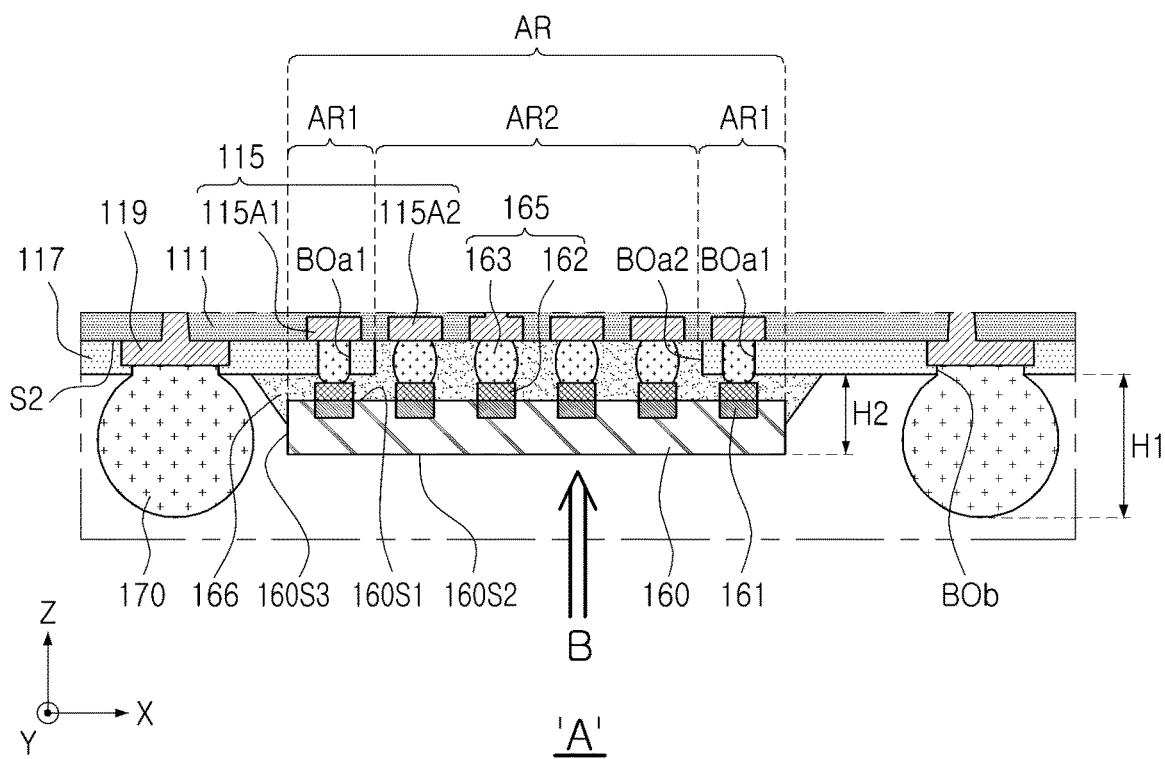
FIG. 2 is a partially enlarged view illustrating region 'A' of FIG. 1 according to example embodiments.
Figure 3A:
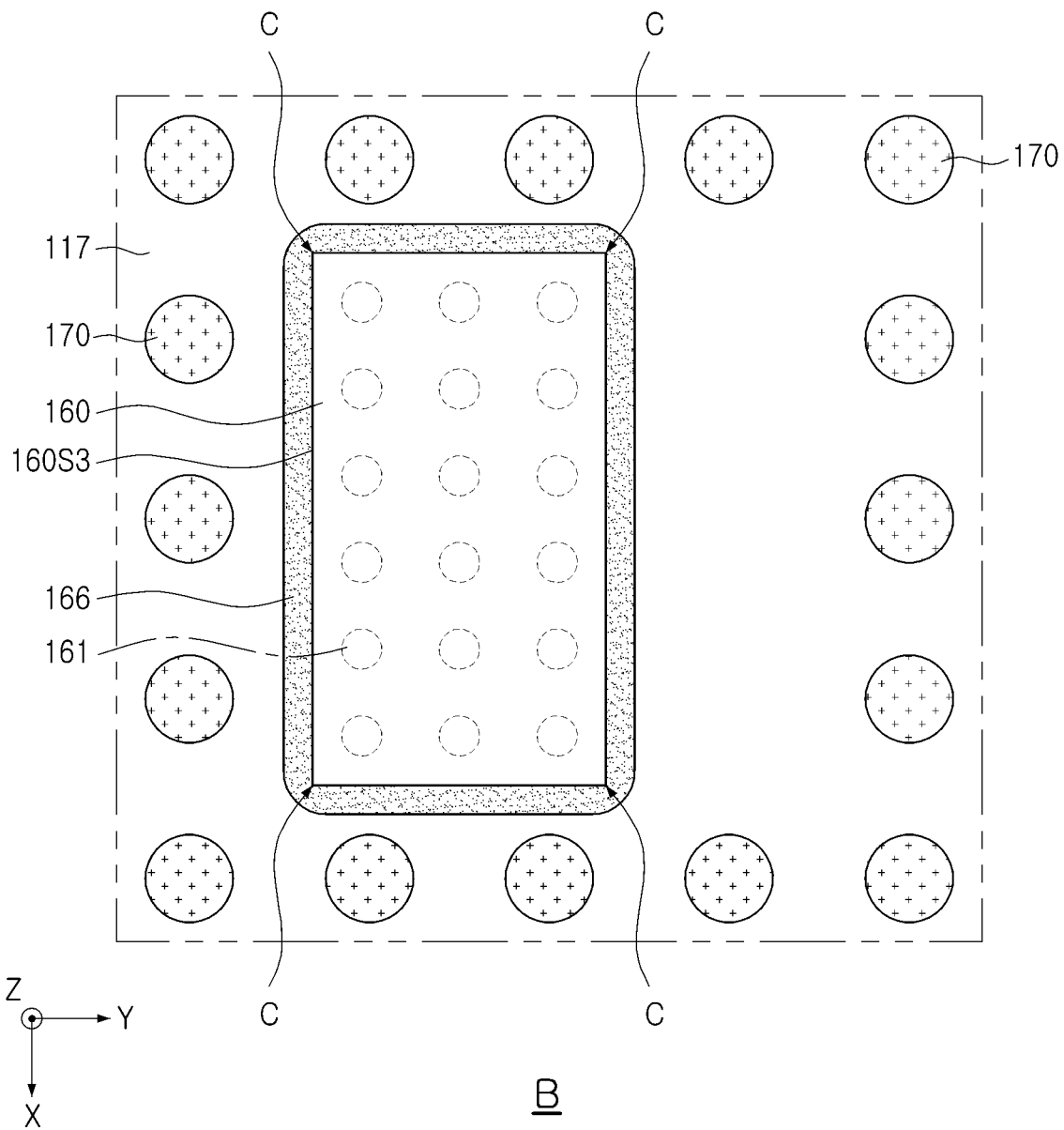
FIG. 3A is a plan view of the portion illustrated in FIG. 2 according to example embodiments.
Figure 3B:
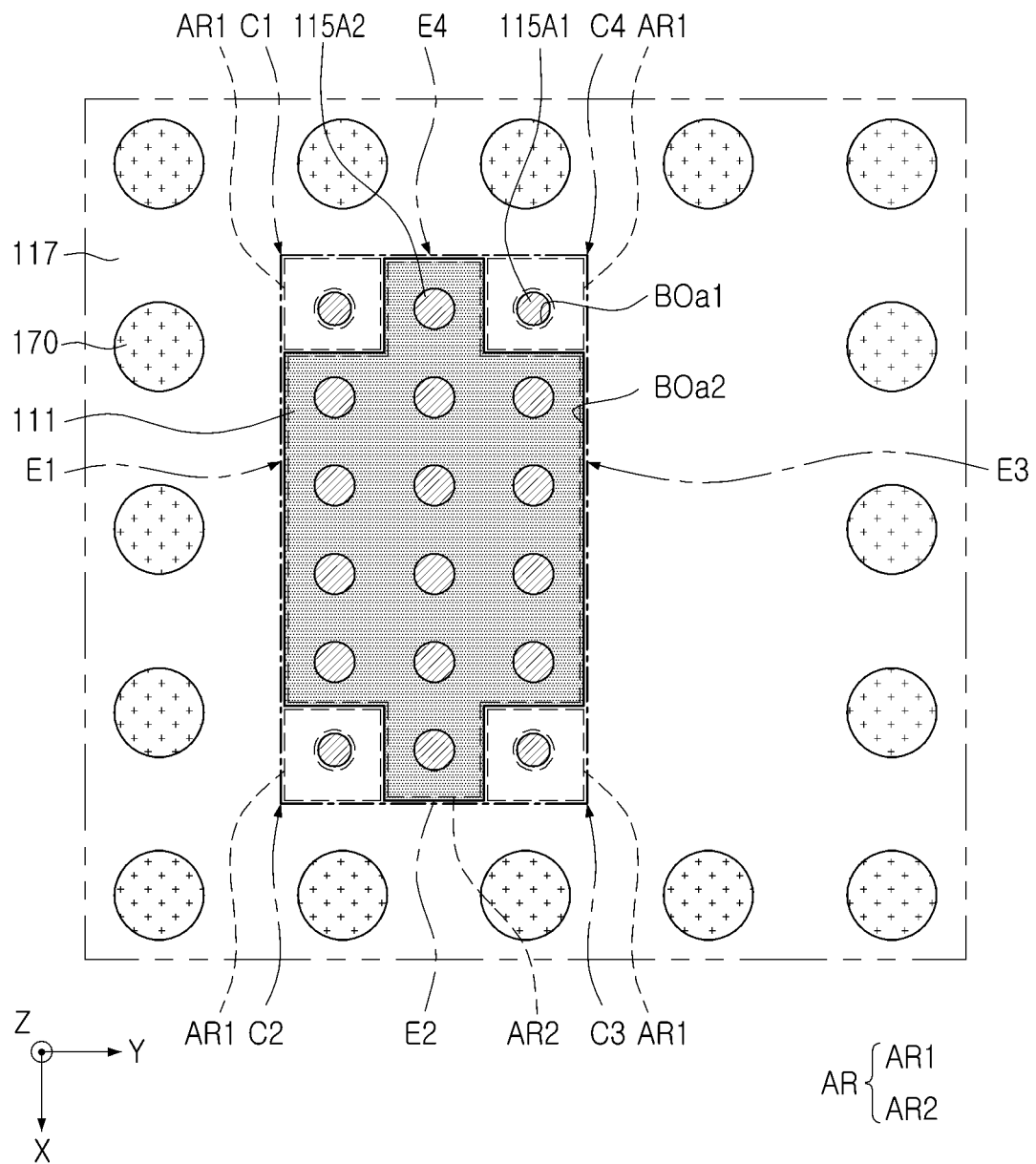
FIG. 3B is a plan view viewed after removing the semiconductor device and the sealing material in FIG. 3A according to example embodiments.

FIG. 1 is a cross-sectional view illustrating a semiconductor package according to an example embodiment of the present inventive concept, FIG. 2 is a partially enlarged view illustrating region 'A' of FIG. 1 according to example embodiments, FIG. 3A is a plan view of the portion illustrated in FIG. 2 according to example embodiments, and FIG. 3B is a plan view viewed after removing the semiconductor device and the sealing material in FIG. 3A according to example embodiments.

Referring to FIGS. 1 and 2, a semiconductor package 100 according to an example embodiment may include a package substrate 110, a semiconductor chip 120, a passive device 160, and a sealing material 166. According to an example embodiment, the semiconductor package 100 according to an embodiment may further include an encapsulant 150 and connection bumps 170. As used herein, the singular forms "a", "an" and "the" are intended to include the plural forms as well, unless the context clearly indicates otherwise.

The package substrate 110 is a support substrate on which the semiconductor chip 120 is mounted, and may be a redistribution structure for redistributing connection pads 121 of the semiconductor chip 120. For example, the package substrate 110 may be a printed circuit board (PCB) The package substrate 110 may include a base substrate 118 having a front surface S1 and a rear surface S2 disposed in opposite directions, and front pads 114 and rear pads 115 respectively disposed on the front surface S1 and the rear surface S2, a front protective layer 116 having front openings FO respectively exposing the front pads 114 and covering the front surface S1, a rear protective layer 117 having rear openings BO exposing the rear pads 115 and covering the rear surface S2.

The base substrate 118 may include a plurality of insulating layers 111 and a plurality of redistribution layers 112 disposed in the plurality of insulating layers 111, and redistribution vias 113.

The insulating layers 111 may include or be formed of an insulating resin. The insulating resin may include or be formed of a thermosetting resin such as an epoxy resin, a thermoplastic resin such as polyimide, or a resin impregnated with inorganic fillers or/and glass fibers (Glass Fiber, Glass Cloth, Glass Fabric) in these resins, for example, prepreg, Ajinomoto Build-up Film (ABF), FR-4, Bismaleimide Triazine (BT), or a photosensitive resin such as a Photoimageable Dielectric (PID). The insulating layers 111 may be stacked in a vertical direction (Z-axis direction). Among the plurality of insulating layers 111, an uppermost insulating layer 111a may provide the front surface S1, and the lowermost insulating layer 111b may provide the rear surface S2. Depending on the process, a boundary between the plurality of insulating layers 111 may be unclear. In an example embodiment, only three insulating layers 111, for example, 111a, 111b, and 111c, are illustrated in the drawing, but example embodiments of the present inventive concept are not limited thereto. According to an example embodiment, fewer or greater numbers of insulating layers 111 to those illustrated in the drawings may be provided, but more may be formed. In addition, as an example, a core insulating layer 111c located in a middle among the plurality of insulating layers 111 may be thicker than the insulating layers 111 stacked on upper and lower portions thereof. The core insulating layer 111c may suppress warpage of a substrate by improving rigidity of the substrate. The core insulating layer 111c may be formed using, for example, a copper clad laminate (CCL), an unclad copper clad laminate (Unclad CCL), a glass substrate or a ceramic substrate.

According to an example embodiment, the package substrate 110 may not include a core insulating layer 111c.

The redistribution layer 112 may include or be formed of, for example, copper (Cu), aluminum (Al), silver (Ag), tin (Sn), gold (Au), nickel (Ni), lead (Pb), titanium (Ti), or a metal material including alloys thereof. The redistribution layer 112 may be provided as a plurality of redistribution layers 112 respectively disposed on the plurality of insulating layers 111. The plurality of redistribution layers 112 may be electrically connected to each other through redistribution vias 113. The number of layers of the redistribution layer 112 may be determined according to the number of layers of the insulating layers 111, and may include more or fewer layers than illustrated in the drawings.

The redistribution vias 113 may be electrically connected to the redistribution layer 112, and may include a signal via, a ground via, and a power via. The redistribution vias 113 may include or be formed of, for example, copper (Cu), aluminum (Al), silver (Ag), tin (Sn), gold (Au), nickel (Ni), lead (Pb), titanium (Ti), or a metal material including alloys thereof. Each of the redistribution vias 113 may have a filled via in which a metal material is filled or a conformal via in which a metal material is formed along an inner wall of the via hole. The redistribution vias 113 may be integrally formed with the redistribution layer 112, but example embodiments of the present inventive concept are not limited thereto.

Front pads 114 and rear pads 115 may be respectively disposed on the front surface S1 and the rear surface S2 of the base substrate 118. In addition, connection pads 119 may be disposed on the rear surface S2 of the base substrate 118.

The front pads 114 may be disposed on the front surface S1 of the base substrate 118, and may be used as landing pads to which the semiconductor chip 120 is connected. The front pads 114 may be electrically connected to the redistribution layer 112 through the redistribution vias 113. The front pads 114 may include the same material as the redistribution layer 112. For example, the front pads 114 may include or be formed of copper (Cu), aluminum (Al), silver (Ag), tin (Sn), gold (Au), nickel (Ni), lead (Pb), titanium (Ti), or a metal material including alloys thereof. The front pads 114 may be disposed to protrude on the front surface S1 of the base substrate 118, but the present inventive concept is not limited thereto. According to an example embodiment, the front pads 114 may be formed so that a surface thereof is coplanar with the front surface S1 of the base substrate 118.

Referring to FIGS. 3A and 3B, the rear pads 115 may be disposed in rows and columns on the rear surface S2 of the base substrate 118, and may be used as landing pads to which the passive device 160 are connected. The rear pads 115 may be electrically connected to the redistribution layer 112 through the redistribution vias 113. The rear pads 115 may include the same material as the redistribution layer 112. The rear pads 115 may include or be formed of, for example, copper (Cu), aluminum (Al), silver (Ag), tin (Sn), gold (Au), nickel (Ni), lead (Pb), titanium (Ti), or a metal material including alloys thereof.

The rear pads 115 may include first rear pads 115A1 and second rear pads 115A2 classified according to a region disposed in a mounting region AR in which the passive device 160 is mounted. The mounting region AR in which the passive device 160 is mounted may have first to fourth corners C1, C2, C3, and C4 corresponding to each corner C of the passive device 160, and first to fourth edges E1, E2, E3, and E4 of the mounting region AR connecting the first to fourth corners C1, C2, C3, and C4. The mounting region AR may include first regions AR1 adjacent to the first to fourth corners C1, C2, C3, and C4, respectively, and a second area AR2 other than the first regions AR1. The second region AR2 may be disposed to divide the first regions AR1 into at least two groups. For example, when the mounting region AR has a quadrangular shape, the first regions AR1 may include four regions to be adjacent to the first to fourth edges E1, E2, E3, and E4 of the mounting region AR, respectively, and the second region AR2 may be disposed in a +-shape dividing the first regions AR1, respectively. Also, according to an example embodiment, the first regions AR1 may include two regions adjacent to the two of the first to fourth edges E1, E2, E3, and E4 of the mounting region AR.

At least one of the first rear pads 115A1 may be disposed in each of the first regions AR1. In addition, at least one first rear pad 115A1 adjacent to the first to fourth corners C1, C2, C3, and C4 may be disposed in the first regions AR1, respectively. The second rear pads 115A2 may be disposed in the second region AR2. The disposition of the mounting region AR, the first rear pads 115A1 and the second rear pads 115A2 will be described in detail later.

Referring back to FIGS. 1 and 2, connection pads 119 may be disposed on the rear surface S2 of the base substrate 118, and may be used as landing pads to which the connection bumps 170 are connected. The connection pads 119 may be electrically connected to the redistribution layer 112 through the redistribution vias 113. For example, the lowermost insulating layer 111b may include connection openings exposing at least a portion of the connection pads 119. The openings of the lowermost insulating layer 111b may correspond to the redistribution vias 113. The connection pads 119 may include the same material as the redistribution layer 112. For example, the connection pads 119 may include or be formed of copper (Cu), aluminum (Al), silver (Ag), tin (Sn), gold (Au), nickel (Ni), lead (Pb), titanium (Ti), or a metal material including alloys thereof. According to an embodiment, in an X-axis direction, a width of the connection pads 119 may be greater than a width of the rear pads 115. In addition, according to an example embodiment, in the X-axis direction, a pitch of the connection pads 119 may be greater than a pitch of the rear pads 115. In addition, according to an example embodiment, lower surfaces of the connection pads 119 and a lower surface of the lowermost insulating layer 111b (i.e., the rear surface S2 of the base substrate 118) may be disposed at different levels. For example, the lower surfaces of the connection pads 119 may protrude further than the rear surface S2 of the base substrate 118 and be disposed at a lower level, and lower surfaces of the rear pads 115 may be disposed at the same level as the rear surface S2. However, an example embodiment of the present inventive concept is not limited thereto. According to an example embodiment, the rear pads 115 may be disposed to protrude from the rear surface S2 of the base substrate 118, and the lower surfaces of the connection pads 119 may be disposed at the same level as the rear surface S2 of the base substrate 118.

The front protective layer 116 and the rear protective layer 117 may be disposed to cover the front surface S1 and the rear surface S2 of the base substrate 118, respectively. The front protective layer 116 and the rear protective layer 117 may cover the redistribution layer 112 to protect the same from external physical/chemical damages. The front protective layer 116 and the rear protective layer 117 may include or be formed of a solder resist material or a photo solder resist material.

The front openings FO in the front protective layer 116 through which the front pads 114 are exposed may be formed in the front protective layer 116.

The rear openings BO in the rear protective layer 117 may include first through third rear openings BOa1, BOa2, and Bob. The first rear openings BOa1 and the second rear opening BOa2 through which the rear pads 115 are exposed to a bottom surface of the rear protection layer 117 may be formed. In addition, the third rear openings BOb through which the connection pads 119 are exposed on a bottom surface of the rear protective layer 117 may be formed. The second rear opening BOa2 may have a side surface overlapping one of the first to fourth edges E1, E2, E3, and E4. In some examples, the second rear opening BOa2 may have a side surface overlapping at least two of the first to fourth edges E1, E2, E3, and E4.

Referring to FIG. 3B, the first rear openings BOa1 and the second rear opening BOa2 through which the rear pads 115 are exposed on a bottom surface of each of the first rear openings BOa1 and the second rear opening BOa2 will be described in detail.

The first rear openings BOa1 may be respectively disposed in the first regions AR1 of the mounting region AR, and the first rear pads 115A1 may be respectively exposed on bottom surfaces of the first rear openings BOa1. For example, each of the first rear openings BOa1 may be disposed to correspond to one of the first rear pads 115A1 to individually expose the first rear pads 115A1. In an X-axis direction, a width of the first rear openings BOa1 may be smaller than a width of the first rear pads 115A1. In some example embodiments, the width of the first rear openings BOa1 may be substantially the same as the width of the first rear pads 115A1.

At least one first rear opening BOa1 may be disposed in each of the first rear openings BOa1 in the first regions AR1 of the mounting region AR. One such first rear opening BOa1 may be disposed adjacent to respective corners C1, C2, C3, and C4 of each of the first regions AR1. The first rear openings BOa1 may be symmetrically disposed on the mounting region AR. For example, the same number of first rear openings BOa1 may be disposed in each of the first regions AR1, and may be symmetrically disposed in X-axis and Y-axis directions with respect to a center of the mounting region AR.

The first rear openings BOa1 may prevent the passive device 160 from being tilted or shifted while the passive device 160 is mounted. Since one of the first rear pads 115A1 is disposed on a bottom surface of each of the first rear openings BOa1 to fill the bottom surface, the lowermost insulating layer 111b forming the rear surface S2 of the base substrate 118 may not be exposed to bottom surfaces of the rear openings BOa1. In addition, in the process of mounting the passive device 160, the solder filled in the first rear openings BOa1 may be supported by sidewalls of the first rear openings BOa1. Therefore, the solder filled in the first rear openings BOa1 is supported by the sidewalls of the first rear openings BOa1 even when pressure is applied in the process of attaching the passive device 160, so that the passive device 160 mounted thereon can be stably supported. Therefore, in the process of mounting the passive device 160, it is possible to prevent the passive device 160 from being tilted or shifted due to the flow of solder by the passive device 160.

The second rear opening BOa2 may be disposed in a second region AR2 of the mounting region AR to have a shape corresponding to that of the second region AR2. For example, the second rear opening BOa2 may be formed in a portion of the mounting region AR except for the first regions AR1. In example embodiments, the second rear opening BOa2 may be disposed to divide the first rear openings BOa1 into at least two groups. For example, a first group of the first rear openings BOa1 may include one of the first rear openings BOa1 disposed in the first corner C1 of the mounting region AR and one of the first rear openings BOa1 disposed in the fourth corner C4 of the mounting region AR, and a second group of the first rear openings BOa1 may include one of the first rear openings BOa1 disposed in the second corner C2 of the mounting region AR and one of the first rear openings BOa1 disposed in the third corner C3 of the mounting region AR. However, depending on the example embodiment, the shape of the second rear opening BOa2 may not be the same as that of the second region AR2, and the second rear opening BOa2 may be formed to be smaller or larger by a predetermined size, and may be formed by being divided into a plurality of regions. Second rear pads 115A2 and the lowermost insulating layer 111b forming the rear surface S2 may be exposed on the bottom surface of the second rear opening BOa2.

The second rear opening BOa2 may provide a filling space filled with an underfill resin in the process of applying the underfill resin to form a sealing material 166 for sealing the mounted passive device 160. If a gap between the passive device 160 mounted in the mounting region AR and the rear protective layer 117 is very small, sufficient capillary force may not act on the underfill resin applied to form the sealing material 166, so that the underfill resin may not sufficiently flow into a lower portion of the passive device 160. In this case, a void may be generated in the lower portion of the passive device 160, which may cause a problem that cracks easily occur in the sealing material 166. The second rear opening BOa2 may increase the gap between the passive device 160 and the rear protective layer 117 so that sufficient capillary force acts on the underfill resin applied to form the sealing material 166. Accordingly, a defect in which a crack is generated in the sealing material 166 due to the void can be prevented.

As described above, in the semiconductor package 100 according to an example embodiment, reliability of the passive device 160 mounted thereon by the first rear openings BOa1 and the second rear opening BOa2 formed in the rear protective layer 117 can be improved.

The semiconductor chip 120 may be disposed on the front surface S1 of the package substrate 110, and may include a connection pad 121 electrically connected to the redistribution layer 112. The semiconductor chip 120 may include or be formed of silicon (Si), germanium (Ge), or gallium arsenide (GaAs), and various types of integrated circuits may be formed therein. The integrated circuit may be a processor chip such as a central processor unit (e.g., CPU), a graphics processor unit (e.g., GPU), a field programmable gate array (FPGA), an application processor (AP), a digital signal processor, a cryptographic processor, a microprocessor, and the like, but an example embodiment is not limited thereto, and the integrated circuit may be a logic chip such as an analog-digital converter, an application-specific IC (ASIC), and the like, and the integrated circuit may be a memory chip such as a volatile memory (e.g., DRAM), a non-volatile memory (e.g., ROM and a flash memory), and the like. For example, the semiconductor chip 120 may be mounted on the package substrate 110 in a flip-chip method. The semiconductor chip 120 may be connected to the front pads 114 through metal bumps in the form of balls or posts. For example, the semiconductor chip 120 may be electrically connected to the front pads 114 through solder bumps 125, but an example embodiment thereof is not limited thereto. According to an example embodiment, the semiconductor chip 120 may be directly connected to the front pads 114 or the redistribution vias 113 without a separate bump, or may be mounted on the package substrate 110 by wire bonding. The connection pad 121 may be a pad of a bare chip (e.g., an aluminum (Al) pad), but according to an example embodiment, may be a pad of a packaged chip (e.g., a copper (Cu) pad).

The encapsulant 150 may encapsulate at least a portion of the semiconductor chip 120 on the front protective layer 116. The encapsulant 150 may include or be formed of, for example, a thermosetting resin such as an epoxy resin, a thermoplastic resin such as polyimide, or a prepreg, ABF, FR-4, BT, and an epoxy molding compound (EMC) including an inorganic filler or/and glass fiber. The encapsulant 150 may have a molded underfill (MUF) structure integrally formed with an underfill resin between the semiconductor chip 120 and the package substrate 110, but an example embodiment thereof is not limited thereto. Depending on example embodiments, the encapsulant 150 may also have a capillary underfill (CUF) structure in which the underfill resin under the semiconductor chip 120 is separated.

The passive device 160 is disposed in the mounting region AR of the rear protective layer 117, and may have a connected surface 160S1 facing the mounting region AR and on which connection terminals 161 are disposed, an unconnected surface 160S2 opposite to the connected surface 160S1, and a side surface 160S3 between the connected surface 160S1 and the unconnected surface 160S2. Here, the "unconnected surface" may refer to a surface exposed externally of the semiconductor package located opposite to a surface facing the package substrate 110. The passive device 160 may include or be formed of, for example, a capacitor, an inductor, beads, or the like. For example, the passive device 160 may be a silicon (Si) capacitor in the form of a semiconductor chip having a high capacitance. The passive device 160 may include a connection terminal 161 and a connection member 165 electrically connecting the connection terminal 161 to the rear pads 115. For example, the connection member 165 may include a pillar portion 162 in contact with the connection terminal 161, and a solder portion 163 connecting the pillar portion 162 to the rear pads 115. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The sealing material 166 may include or be formed of an insulating resin similar to that of the encapsulant 150, for example, EMC. The sealing material 166 may be spaced apart from the connection bump 170, and may electrically insulate the passive device 160 and the connection bump 170 from each other. The sealing material 166 may cover the entire connection surface 160S1 of the passive device 160, and may cover at least a portion of the side surface 160S3.

The connection bump 170 may be disposed on the rear surface S2 of the package substrate 110 to be adjacent to the passive device 160, and may be electrically connected to the redistribution layer 112. The connection bump 170 may physically and/or electrically connect the semiconductor package 100 to an external device. As used herein, the term "and/or" or "or/and" includes any and all combinations of one or more of the associated listed items and may be abbreviated as "/". The connection bump 170 includes a conductive material, and may have a ball, pin, or lead shape. For example, the connection bump 170 may be a solder ball. In a Z-axis direction, the connection bump 170 may have a height H1 greater than a height H2 at which a top surface of the rear protective layer 117 is formed.

Modified examples of a package substrate employable in a semiconductor package will be described with reference to FIGS. 4 to 6, 7A to 7C, and 8 to 10. FIGS. 4 to 6, 7A to 7C, and 8 to 10 are modified examples of the package substrate illustrated in FIG. 3B according to example embodiments. The modified examples of FIGS. 4 to 6, 7A to 7C, and 8 to 10 may have substantially the same or similar structure as the package substrate 110 of FIG. 3B, and the same or similar components may be denoted by the same or similar reference numerals, and also, repeated descriptions of the same components may be omitted.

Figure 4:
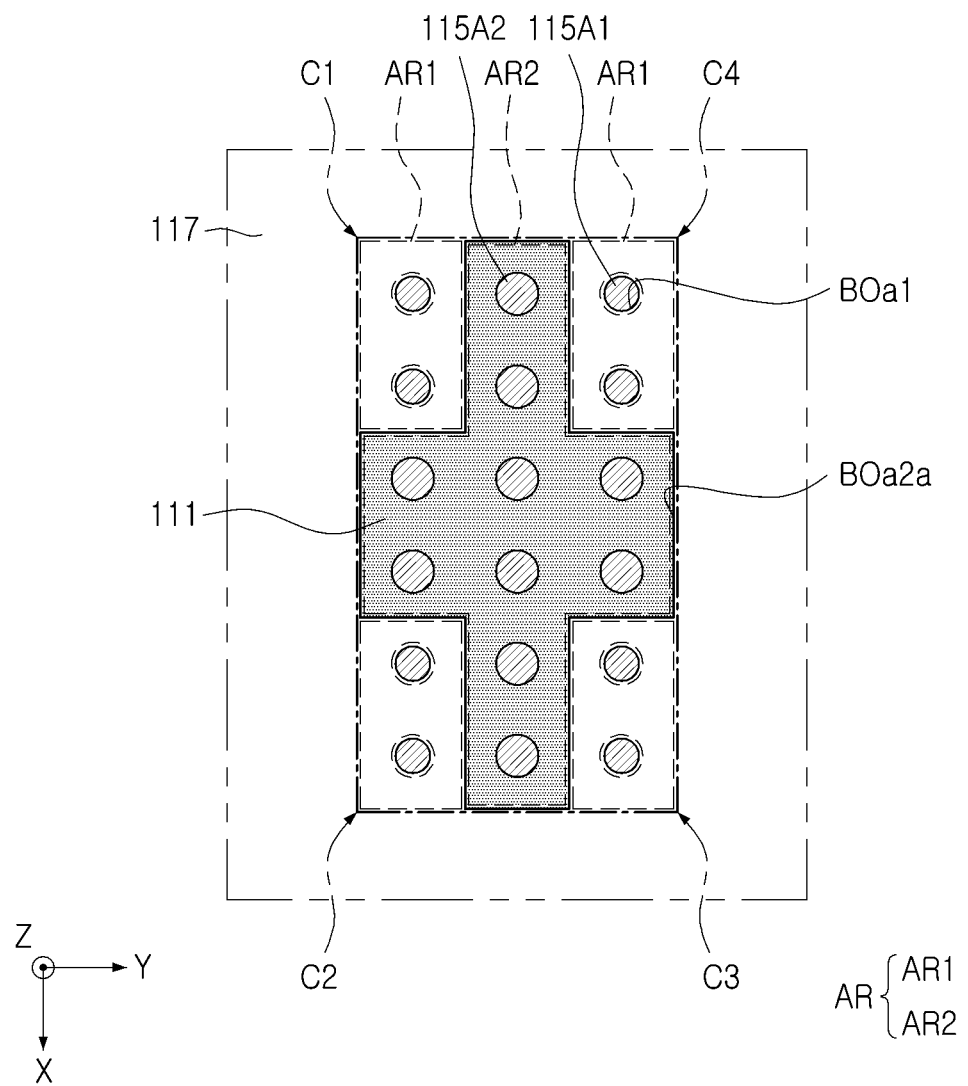
FIGS. 4 to 6, 7A to 7C, and 8 to 10 are modified examples of the package substrate illustrated in FIG. 3B according to example embodiments.

Referring to FIG. 4, a package substrate 110A according to an example embodiment has a difference in that the number of first rear openings BOa1 respectively disposed in the first regions AR1 of the mounting region AR is increased compared to the above-described example embodiment of FIG. 3B. In the package substrate 110A of the example embodiment, compared to the above-described example embodiment of FIG. 3B, an area of a second rear opening BOa2a may be reduced, so that a filling spaced filled with an underfill resin is reduced, but the number of first rear openings BOa1 respectively included in the first regions AR1 may be increased, so that an effect of preventing defects in which the passive device 160 is tilted or shifted may be improved. In example embodiments, the second rear opening BOa2a may be disposed to divide the first rear openings BOa1 into at least two groups. For example, a first group of the first rear openings BOa1 may include two of the first rear openings BOa1 disposed in a first corner C1 of the mounting region AR and two of the first rear openings BOa1 disposed in the fourth corner C4 of the mounting region AR, and a second group of the first rear openings BOa1 may include two of the first rear openings BOa1 disposed in the second corner C2 of the mounting region AR and two of the first rear openings BOa1 disposed in the third corner C3 of the mounting region AR.

Figure 5:
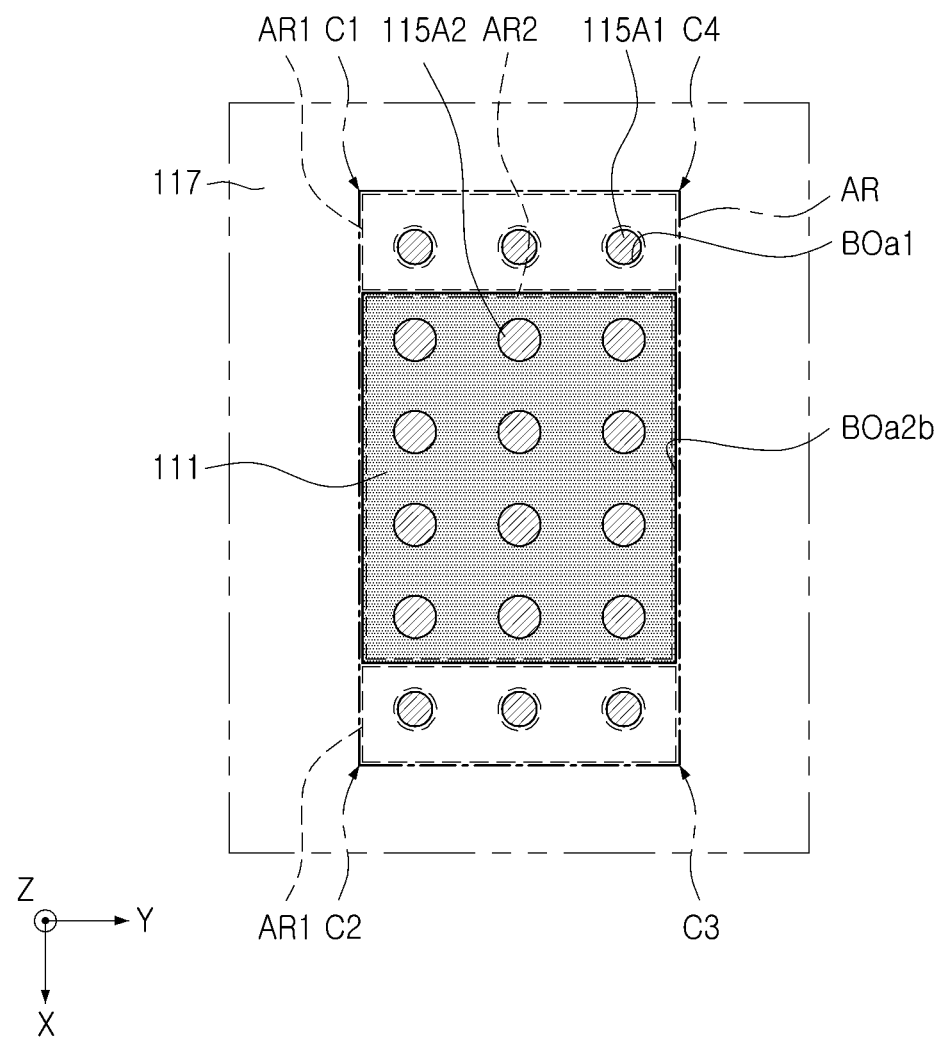

Referring to FIG. 5, a package substrate 110B of an example embodiment has a difference in that the first regions AR1 extend so as to be in contact with two corners of the mounting region AR, respectively, compared to the above-described example embodiments of FIGS. 3B and 4. For example, two first regions AR1 may be disposed on both sides of the second region AR2. For example, a first region of the two first regions AR1 may be disposed adjacent to the fourth edge E4 of the mounting region AR and a second region of the two first regions AR1 may be disposed adjacent to the second edge E2 of the mounting region AR. As in the example embodiment of FIG. 4, compared to the above-described example embodiment of FIG. 3B, an area of a second rear opening BOa2b may be reduced, so that a filling space filled with an underfill resin is reduced, but the number of first rear opening Boa1 respectively included in the first regions AR1 may be increased, so that an effect of preventing defects in which the passive device 160 is tilted or shifted may be improved. In example embodiments, the second rear opening BOa2b may be disposed to divide the first rear openings BOa1 into at least two groups. For example, a first group of the first rear openings BOa1 may include three of the first rear openings BOa1 disposed in the first region of the two first regions AR1, and a second group of the first rear openings Boa1 may include three of the first rear openings Boa1 disposed in the second region of the two first regions AR1.

Figure 6:
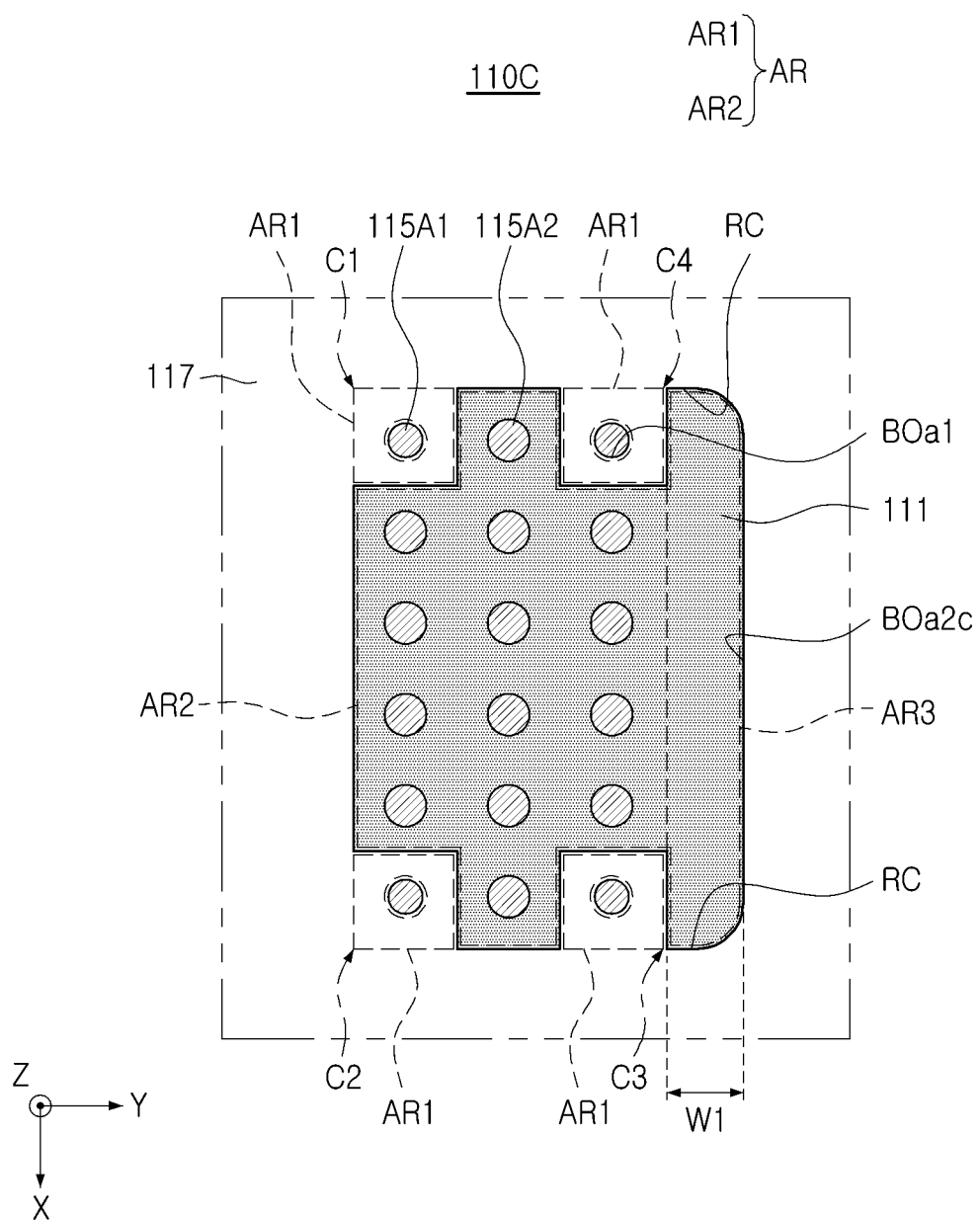

Referring to FIG. 6, a package substrate 110C of an example embodiment has a difference in that a second rear opening BOa2c has an extended region AR3 extending outwardly of the mounting region AR in a Y-axis direction, compared to the above-described example embodiments of FIGS. 3B, 4, and 5. For example, the extended region AR3 may have a width W1 in the Y-axis direction. The extended region AR3 may be used as an injection hole for injecting an underfill resin applied to form a sealing material 166. Both ends RC of the extended region AR3 are formed in a curved shape, so that the injected underfill resin may smoothly flow on a sidewall of the extended region AR3 without being stagnant and can be injected into a second rear opening BOa2c. Accordingly, an effect of preventing defects in which the passive device 160 is tilted or shifted may be improved. In example embodiments, the second rear opening BOa2c may be disposed to divide the first rear openings BOa1 into at least two groups. For example, a first group of the first rear openings BOa1 may include one of the first rear openings BOa1 disposed in the first corner C1 of the mounting region AR and one of the first rear openings BOa1 disposed in the fourth corner C4 of the mounting region AR, and a second group of the first rear openings BOa1 may include one of the first rear openings BOa1 disposed in the second corner C2 of the mounting region AR and one of the first rear openings BOa1 disposed in the third corner C3 of the mounting region AR.

Figure 7A:
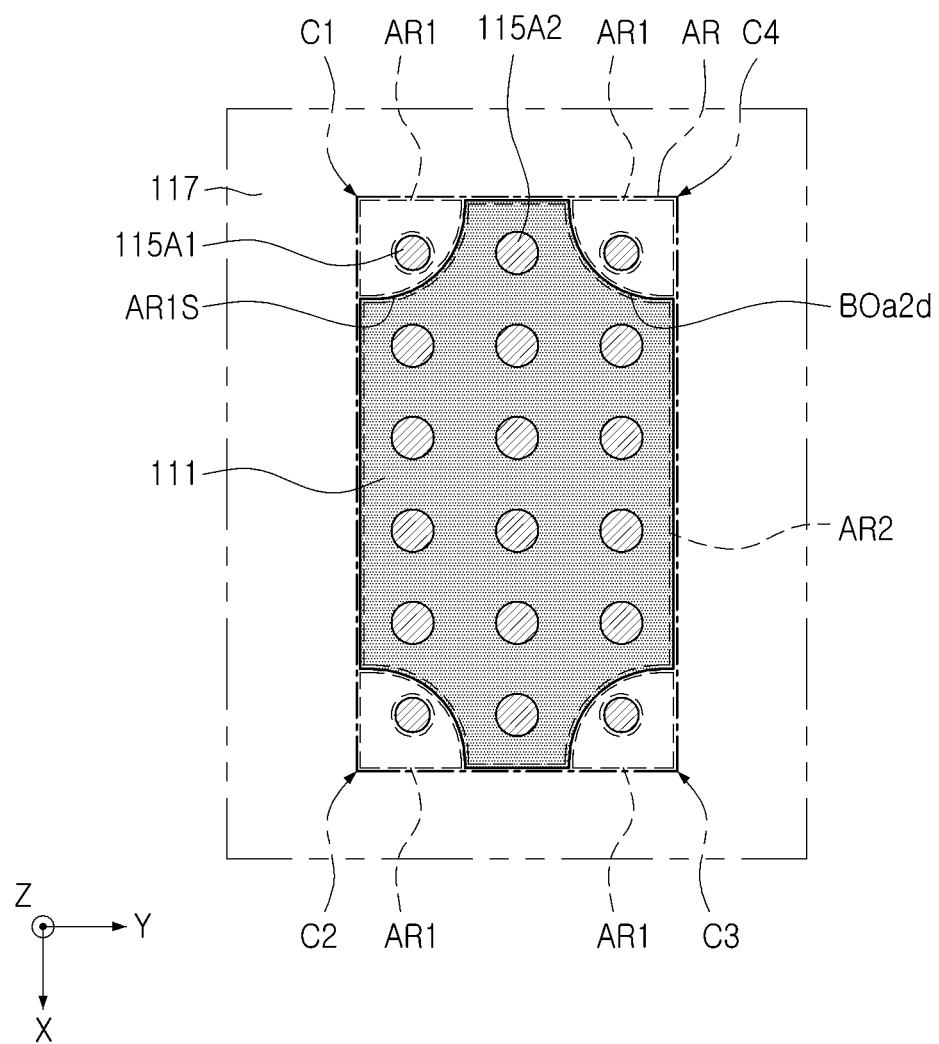

Referring to FIG. 7A, a package substrate 110D according to an example embodiment has a difference in that side surfaces AR1S of the first regions AR1 are formed in a curved surface, compared to the above-described example embodiments. When a corner is formed on the side surfaces AR1S of the first regions AR1 as shown in FIGS. 3B, 4, and 6, the underfill resin applied to form the sealing material 166 may be stagnant in the corner on the side surfaces AR1S. In the package substrate 110D according to an example embodiment, the side surfaces AR1S of the first regions AR1 are formed in a curved shape, so that the underfill resin can easily flow into a second rear opening BOa2d without being stagnant. Accordingly, an effect of preventing defects in which the passive device 160 is tilted or shifted may be improved. In example embodiments, the second rear opening BOa2d may be disposed to divide the first rear openings BOa1 into at least two groups. For example, a first group of the first rear openings BOa1 may include one of the first rear openings BOa1 disposed in the first corner C1 of the mounting region AR and one of the first rear openings BOa1 disposed in the fourth corner C4 of the mounting region AR, and a second group of the first rear openings BOa1 may include one of the first rear openings BOa1 disposed in the second corner C2 of the mounting region AR and one of the first rear openings BOa1 disposed in the third corner C3 of the mounting region AR.

Figure 7B:
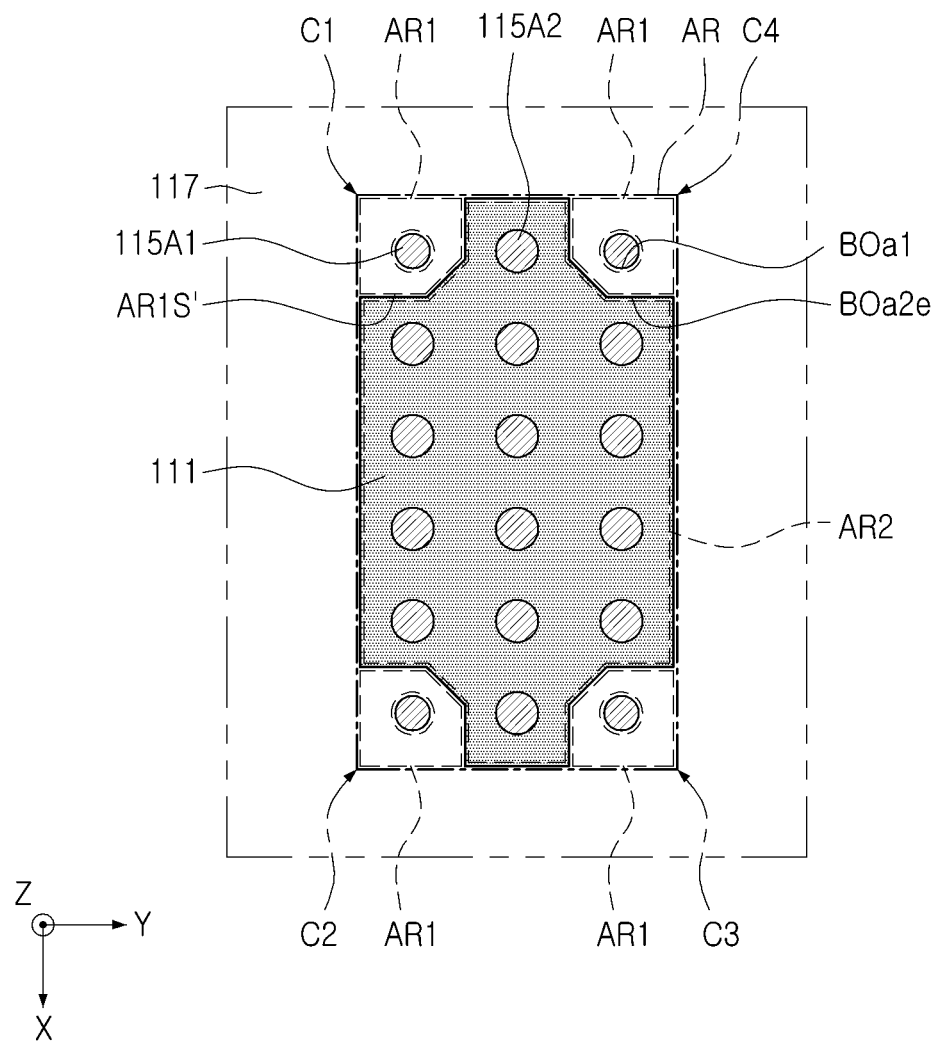

Referring to FIG. 7B, a package substrate 110E according to an example embodiment has a difference in that edges of side surfaces AR1S' of the first regions AR1 are chamfered compared to the above-described example embodiments of FIGS. 3B, 4, 6, and 7A. Accordingly, in the package substrate 110E of an example embodiment, similar to the embodiment of FIG. 7A described above, the underfill resin can easily flow into a second rear opening BOa2e without being stagnant so that an effect of preventing defects in which the passive device 160 is tilted or shifted may be improved. In example embodiments, the second rear opening BOa2e may be disposed to divide the first rear openings BOa1 into at least two groups. For example, a first group of the first rear openings BOa1 may include one of the first rear openings BOa1 disposed in the first corner C1 of the mounting region AR and one of the first rear openings BOa1 disposed in the fourth corner C4 of the mounting region AR, and a second group of the first rear openings BOa1 may include one of the first rear openings BOa1 disposed in the second corner C2 of the mounting region AR and one of the first rear openings BOa1 disposed in the third corner C3 of the mounting region AR.

Figure 7C:
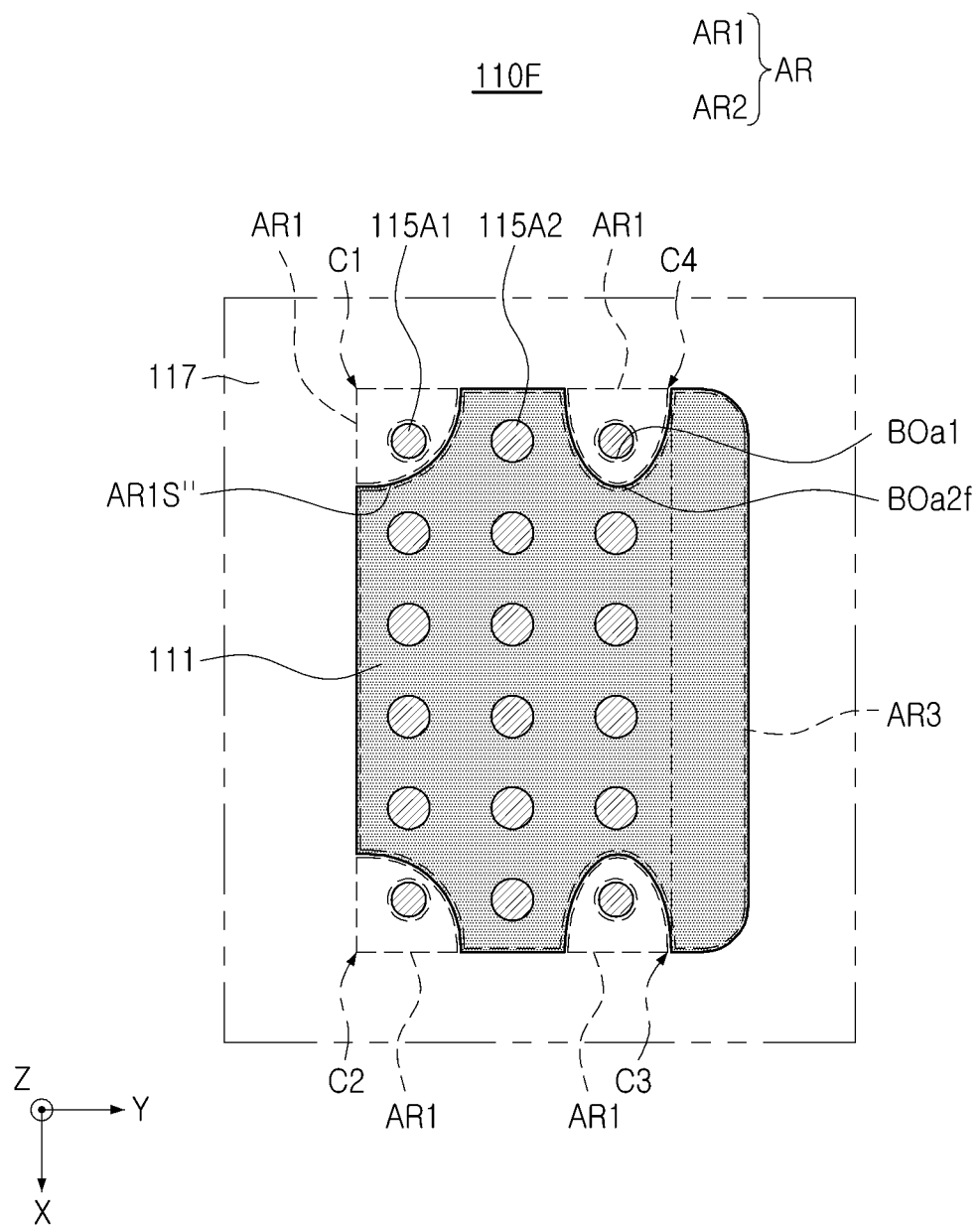

Referring to FIG. 7C, a package substrate 110F according to an example embodiment has a difference in that side surfaces AR1S" of the first regions AR1 are formed in a curved shape and a second rear opening BOa2f has an extended region AR3 extending outwardly of the mounting region AR in a Y-axis direction, compared to the above-described example embodiments of FIGS. 3B, 4 to 6, 7A, and 7B. Accordingly, in the package substrate 110F of the example embodiment, similar to the example embodiment of FIG. 7A described above, the underfill resin may easily flow into the second rear opening BOa2f without being stagnant so that an effect of preventing defects in which the passive device 160 is tilted or shifted may be improved. In example embodiments, the second rear opening BOa2f may be disposed to divide the first rear openings BOa1 into at least two groups. For example, a first group of the first rear openings BOa1 may include one of the first rear openings BOa1 disposed in the first corner C1 of the mounting region AR and one of the first rear openings BOa1 disposed in the fourth corner C4 of the mounting region AR, and a second group of the first rear openings BOa1 may include one of the first rear openings BOa1 disposed in the second corner C2 of the mounting region AR and one of the first rear openings BOa1 disposed in the third corner C3 of the mounting region AR.

Figure 8:
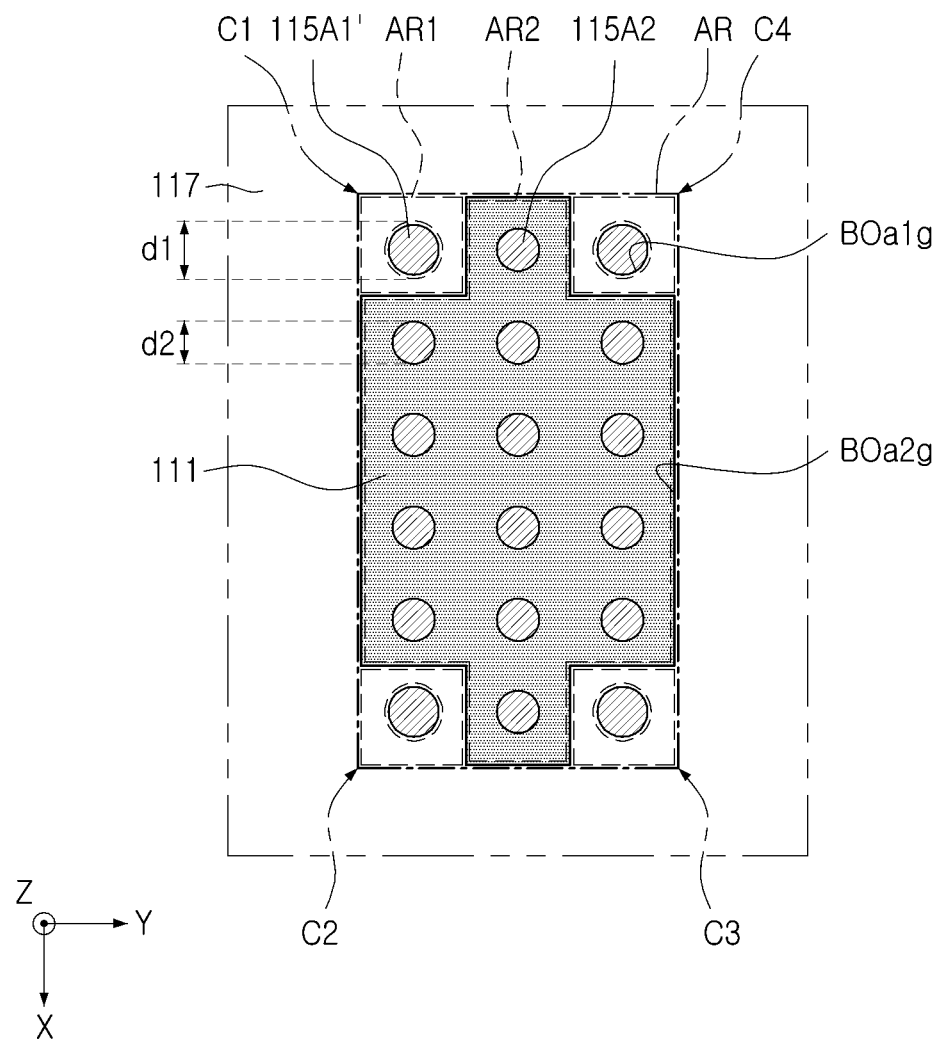

Referring to FIG. 8, a package substrate 110G according to an example embodiment has a difference in that a width d1 of first rear pads 115A1' disposed in the first regions AR1 is increased than a width d2 of second rear pads 115A2, as compared to the above-described example embodiments of FIGS. 3B, 4 to 6, and 7A to 7C. First rear openings BOa1g may be respectively disposed in the first regions AR1 of the mounting region AR, and the first rear pads 115A1' may be respectively exposed on bottom surfaces of the first rear openings BOa1g. A second rear opening BOa2g may be formed in a portion of the mounting region AR except for the first regions AR1. Since the width d1 of the first rear pads 115A1' increases, a width of each of the first rear openings BOa1g may also increase. Accordingly, since an area of the first rear openings BOa1g in the first regions AR1 increases, an effect of preventing the passive device 160 from being tilted or shifted may be improved. In example embodiments, the second rear opening BOa2g may be disposed to divide the first rear openings BOa1g into at least two groups. For example, a first group of the first rear openings BOa1g may include one of the first rear openings BOa1g disposed in the first corner C1 of the mounting region AR and one of the first rear openings BOa1g disposed in the fourth corner C4 of the mounting region AR, and a second group of the first rear openings BOa1g may include one of the first rear openings BOa1g disposed in the second corner C2 of the mounting region AR and one of the first rear openings BOa1g disposed in the third corner C3 of the mounting region AR.

Figure 9:
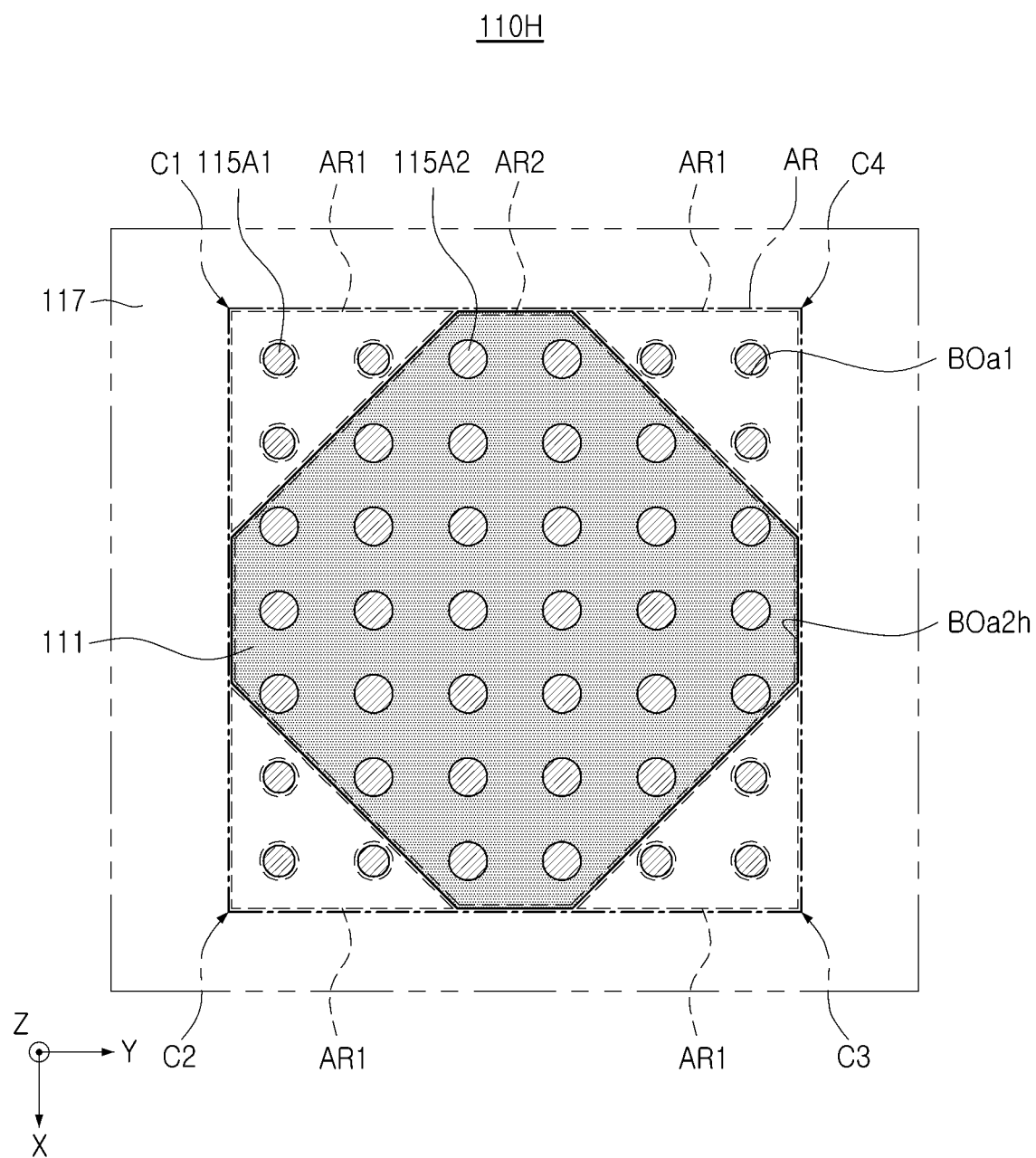

Referring to FIG. 9, a package substrate 110H according to an exemplary embodiment has a difference in that the first regions AR1 are disposed in a triangle, compared to the above-described example embodiments of FIGS. 3B, 4 to 6, 7A to 7C, and 8. First rear openings BOa1 may be respectively disposed in the first regions AR1 of the mounting region AR. Since side surfaces of the first regions AR1 are formed only in a flat plane without corners, an underfill resin may easily flow without being stagnant into a second rear opening BOa2h so that an effect of preventing defects in which the passive device 160 is tilted or shifted may be improved. In example embodiments, the second rear opening Boa2h may be disposed to divide the first rear openings Boa1 into at least two groups. For example, a first group of the first rear openings BOa1 may include three of the first rear openings BOa1 disposed in the first corner C1 of the mounting region AR and three of the first rear openings BOa1 disposed in the fourth corner C4 of the mounting region AR, and a second group of the first rear openings BOa1 may include three of the first rear openings BOa1 disposed in the second corner C2 of the mounting region AR and three of the first rear openings BOa1 disposed in the third corner C3 of the mounting region AR.

Figure 10:
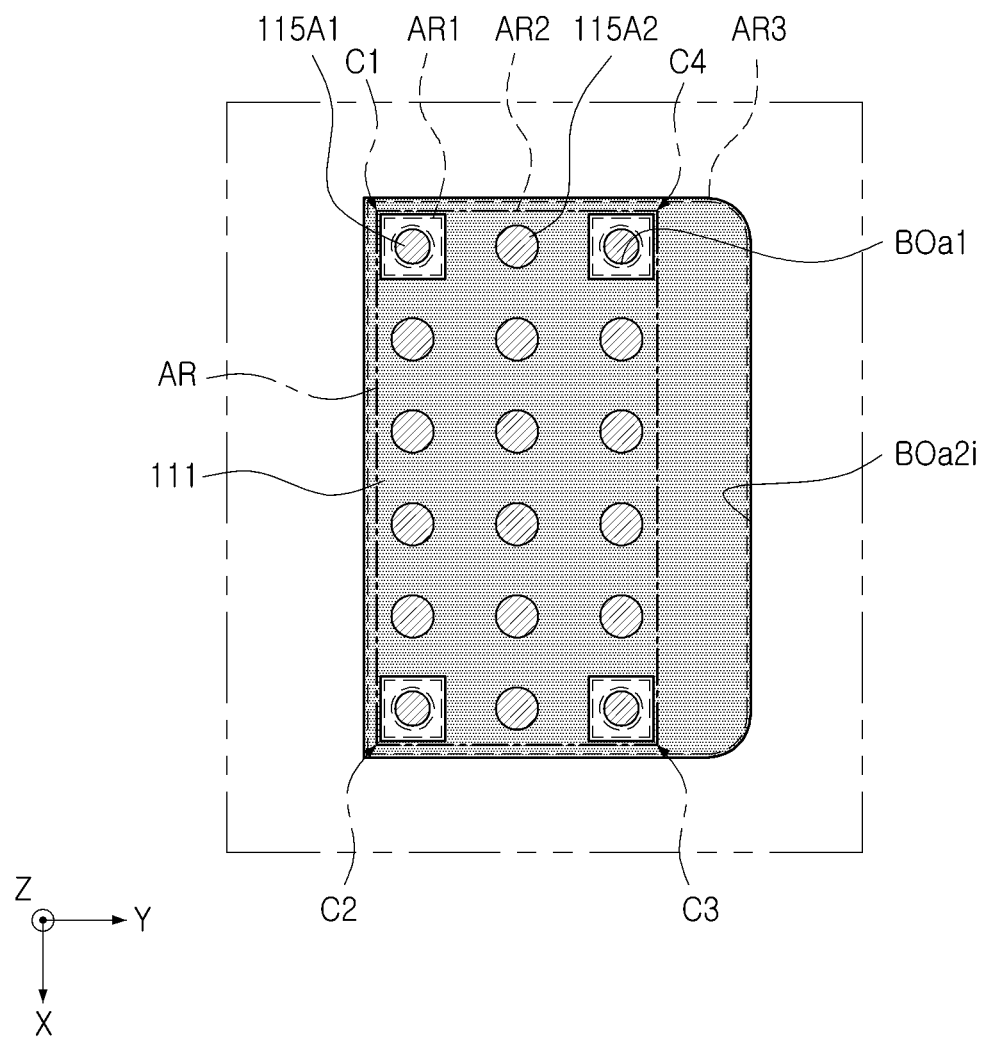

Referring to FIG. 10, a package substrate 110I according to an example embodiment has a difference in that a second rear opening BOa2i has an extended region AR3 extending outwardly of the mounting region AR in X-axis and Y-axis directions, compared to the above-described example embodiments of FIGS. 3B, 4 to 6, 7A to 7C, 8, and 9. Accordingly, the second rear opening BOa2i may be disposed to surround a periphery of the first regions AR1. For example, the extended region AR3 may surround the first to fourth edges E1, E2, E3, and E4 of the mounting region AR. Since a region in which an underfill resin can be filled is formed around a periphery of the first regions AR1, a defect in which the passive device 160 is tilted or shifted may be prevented, and the underfill resin may be effectively injected into each corner of the mounting region AR. In example embodiments, the second rear opening Boa2i may be disposed to divide the first rear openings Boa1 into at least two groups. For example, a first group of the first rear openings BOa1 may include one of the first rear openings BOa1 disposed in the first corner C1 of the mounting region AR and one of the first rear openings BOa1 disposed in the fourth corner C4 of the mounting region AR, and a second group of the first rear openings BOa1 may include one of the first rear openings BOa1 disposed in the second corner C2 of the mounting region AR and one of the first rear openings BOa1 disposed in the third corner C3 of the mounting region AR.

A semiconductor package according to an example embodiment will be described with reference to FIGS. 11 and 12. Example embodiments of FIGS. 11 and 12 may have substantially the same or similar structure as the semiconductor package 100 of FIG. 1, and the same or similar components may be denoted by the same or similar reference numerals, and repeated descriptions of the same components may be omitted.

Figure 11:
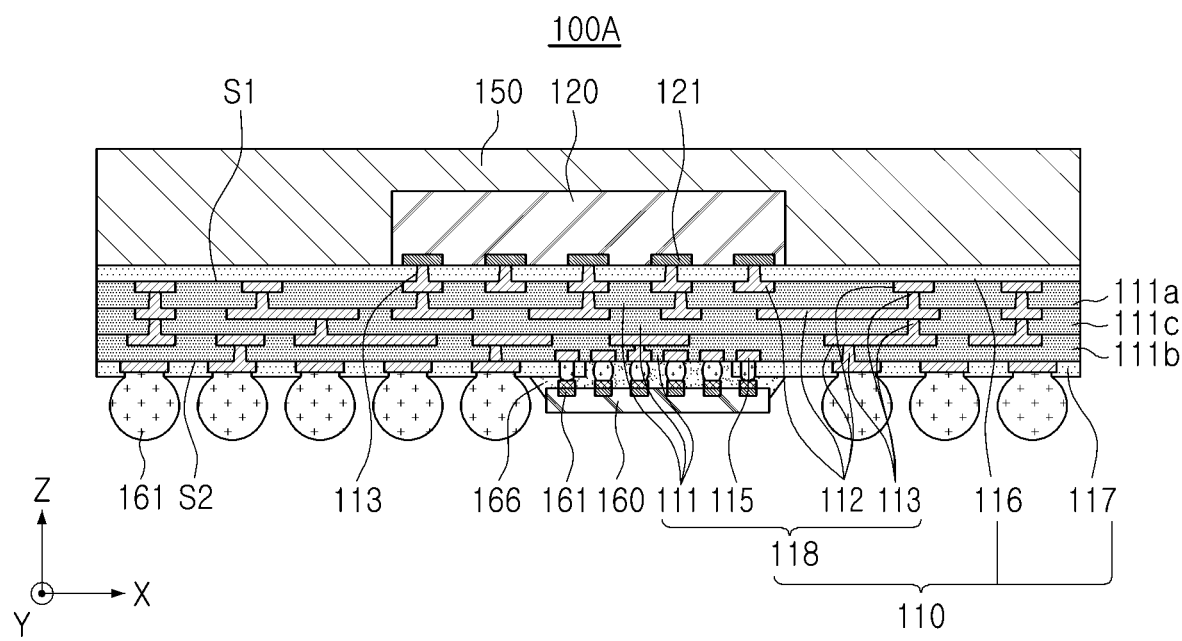
FIG. 11 is a cross-sectional view illustrating a semiconductor package according to an example embodiment of the present inventive concept.

FIG. 11 is a cross-sectional view illustrating a semiconductor package 100A according to an example embodiment of the present inventive concept. Referring to FIG. 11, in the semiconductor package 100A according to an example embodiment, a connection pad 121 and redistribution vias 113 may be directly connected between the semiconductor chip 120 and the package substrate 110 without a connection member, for example, the solder bump 125 of FIG. 1. This structure may be implemented, by encapsulating the semiconductor chip 120 on a temporary carrier using an encapsulant 150, and then directly forming the insulating layers 111, the redistribution layers 112, and the redistribution vias 113 on the lower surfaces of the semiconductor chip 120 and the encapsulant 150 from which the temporary carrier is removed. Accordingly, the connection pad 121 of the semiconductor chip 120 may contact the redistribution vias 113, and the redistribution vias 113 may have a tapered side surface so that a thickness of the base substrate is reduced toward the front surface S1. According to the present example embodiment, an overall thickness of the semiconductor package 100A may be reduced, and connection reliability of the semiconductor chip 120 and the redistribution layer 112 or the redistribution vias 113 may be improved.

Figure 12:
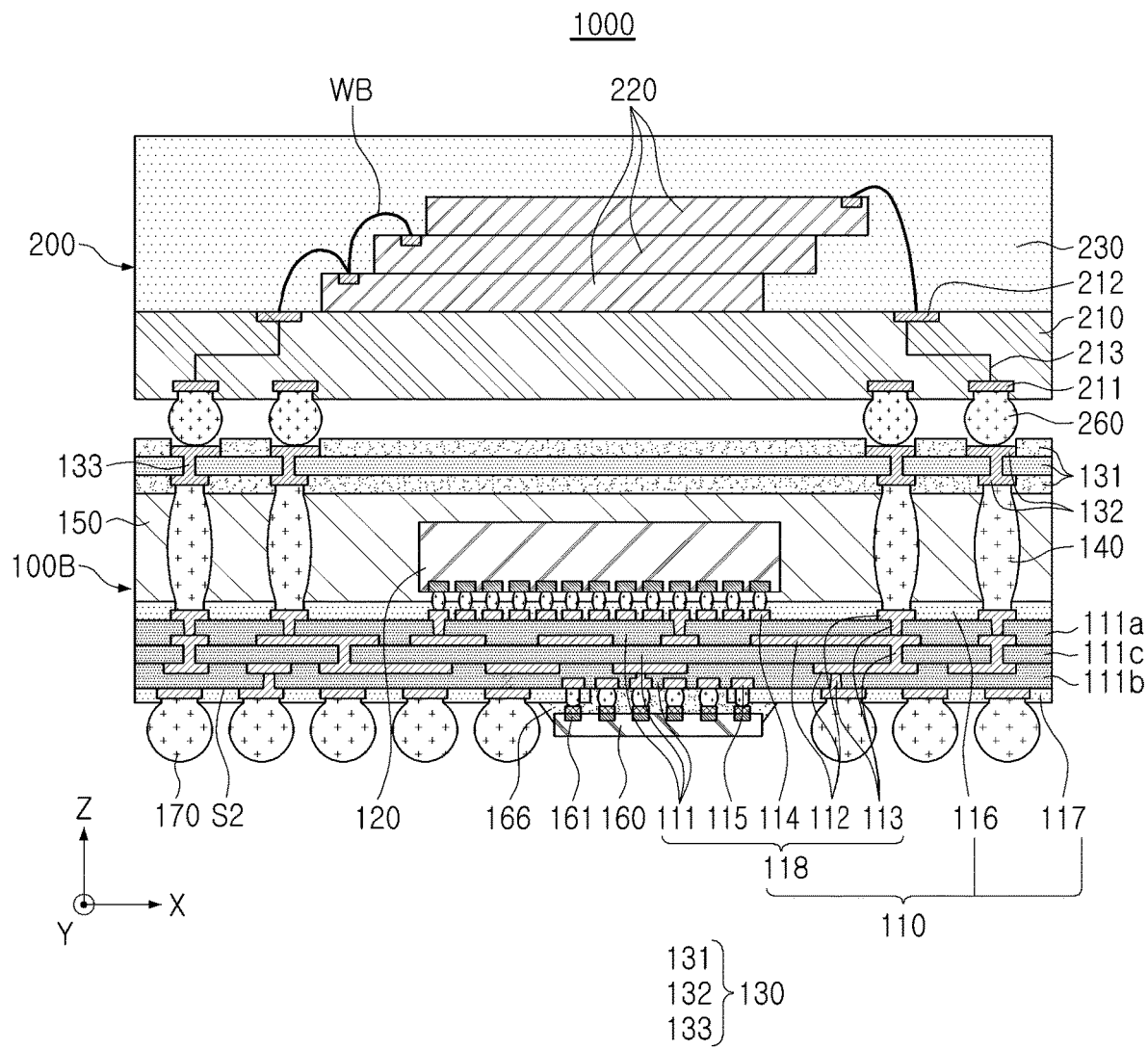
FIG. 12 is a cross-sectional view illustrating a semiconductor package according to an example embodiment of the present inventive concept.

FIG. 12 is a cross-sectional view illustrating a semiconductor package 1000 according to an example embodiment of the present inventive concept. Referring to FIG. 12, the semiconductor package 1000 according to an example embodiment may include a first semiconductor package 100B and a second semiconductor package 200. It can be understood that the first semiconductor package 100B has the same or similar characteristics to the semiconductor package 100 described with reference to FIGS. 1, 2, and 3A except that it further includes an interposer substrate 130 and a connection structure 140.

The interposer substrate 130 is a redistribution substrate providing a redistribution layer on an upper portion or a rear surface of the first semiconductor package 100B, and may be positioned between a lower package and an upper package in a package-on-package structure. The interposer substrate 130 may be disposed on the semiconductor chip 120, and may include an upper insulating layer 131, an upper interconnection layer 132, and an interconnection via 133.

Since the upper insulating layer 131, the upper interconnection layer 132, and the interconnection via 133 have the same or similar characteristics as the insulating layers 111, the redistribution layers 112, and the redistribution vias 113 of the package substrate 110 described above, overlapping descriptions thereof will be omitted. The upper insulating layer 131 may also be provided as a plurality of insulating layers. The uppermost upper insulating layer 131 may include openings exposing at least a portion of the upper interconnection layer 132.

The connection structure 140 may be disposed between the package substrate 110 and the interposer substrate 130, to electrically connect the package substrate 110 and the interposer substrate 130. The connection structure 140 may extend in a vertical direction (Z-axis direction) between the package substrate 110 and the interposer substrate 130, to provide a vertical connection path electrically connecting the redistribution layer 112 and the upper interconnection layer 132. The connection structure 140 may have a spherical or ball shape made of a low-melting point metal such as tin (Sn), indium (In), bismuth (Bi), antimony (Sb), copper (Cu), silver (Ag), zinc (Zn), lead (Pb), or an alloy (e.g., Sn—Ag—Cu) including thereof. According to an example embodiment, a core ball made of a polymer material including a thermoplastic resin and a thermosetting resin, or a metal material distinguished from solder may be disposed inside the connection structure 140.

The second semiconductor package 200 may include a redistribution substrate 210, a plurality of second semiconductor chips 220, and a second encapsulant 230. The redistribution substrate 210 may include a lower pad 211 and an upper pad 212 that can be electrically connected to the outside on a lower surface and an upper surface of the redistribution substrate 210, respectively. Also, the redistribution substrate 210 may include a redistribution circuit 213 electrically connecting the lower pad 211 and the upper pad 212 to each other.

The plurality of second semiconductor chips 220 may be mounted on the redistribution substrate 210 by wire bonding or flip-chip bonding. For example, the plurality of second semiconductor chips 220 may be vertically stacked on the redistribution substrate 210, and electrically connected to the upper pad 212 of the redistribution substrate 210 by a bonding wire WB. For example, each of the plurality of second semiconductor chips 220 may include a memory chip or logic chip, formed on a die from a wafer, and the first semiconductor chip 120 of the first semiconductor package 100B may include an application processor (AP).

The second encapsulant 230 may include the same or similar material to the encapsulant 150 of the first semiconductor package 100B. The second semiconductor package 200 may be physically and electrically connected to the first semiconductor package 100B by metal bumps 260. The metal bump 260 may be electrically connected to the redistribution circuit 213 inside the redistribution substrate 210 through the lower pad 211 of the redistribution substrate 210. The metal bump 260 may include or be formed of a low-melting point metal, for example, tin (Sn) or an alloy including tin (Sn).

As set forth above, according to example embodiments of the present inventive concept, a package substrate and a semiconductor package in which reliability of a mounted semiconductor chip is improved may be provided.

Various and advantageous advantages and effects of the present inventive concept is not limited to the above description, it will be more readily understood in the process of describing the specific embodiments of the present inventive concept.

While the example embodiments have been shown and described above, it will be apparent to those skilled in the art that modifications and variations could be made without departing from the scope of the present inventive concept as defined by the appended claims.

What is claimed is:
1. A semiconductor package, comprising:
a package substrate including:
  a base substrate including a redistribution layer and having a front surface and a rear surface opposite to the front surface,
  front pads disposed on the front surface and electrically connected to the redistribution layer,
  rear pads disposed on the rear surface and electrically connected to the redistribution layer, and the rear pads including first rear pads and second rear pads,
  a front protective layer including front openings respectively exposing the front pads on the front surface, and
  a rear protective layer including a mounting region in which first rear openings respectively exposing the first rear pads and a second rear opening exposing the second rear pads and a portion of the rear surface are disposed on the rear surface;
a semiconductor chip disposed on the front protective layer and connected to the front pads;
a passive device disposed on the mounting region of the rear protective layer, and connected to the rear pads;
connection bumps disposed on the rear surface adjacent to the passive device, and electrically connected to the redistribution layer; and a sealing material spaced apart from the connection bumps, covering a portion of the passive device, and extending into the second rear opening, wherein four first rear openings of the first rear openings are respectively disposed adjacent to respective corners of the mounting region, wherein the second rear opening is disposed to divide the four first rear openings into at least two groups, wherein the first rear openings and the second rear opening are included in the mounting region, and wherein the first rear pads corresponding to the first rear openings and the second rear pads corresponding to the second rear opening are disposed in the mounting region.

2. The semiconductor package of claim 1, wherein the mounting region comprises:

first regions adjacent to the respective corners and respectively including at least one of the four first rear openings; and a second region dividing the first regions and corresponding to the second rear opening.

3. The semiconductor package of claim 2, wherein the first regions have the same shape as each other.

4. The semiconductor package of claim 1, wherein the passive device has a top surface facing the mounting region and on which a connection terminal is disposed, a bottom surface opposite to the top surface, and side surfaces positioned between the top surface and the bottom surface.

5. The semiconductor package of claim 4, wherein the mounting region has first to fourth edges connecting the respective corners, and wherein the first to fourth edges correspond to the side surfaces of the passive device, respectively.

6. The semiconductor package of claim 5, wherein the second rear opening has a side surface overlapping at least two of the first to fourth edges.

7. The semiconductor package of claim 5, wherein the second rear opening further comprises an extended region extending outwardly of at least one of the first to fourth edges of the mounting region, and wherein the sealing material extends into the extended region.

8. The semiconductor package of claim 7, wherein the extended region surrounds the first to fourth edges of the mounting region.

9. The semiconductor package of claim 4, wherein the passive device further comprises a connection member electrically connecting the connection terminal to the rear pads, and wherein the connection member comprises a pillar portion in contact with the connection terminal and a solder portion connecting the pillar portion to the rear pads.

10. The semiconductor package of claim 1, further comprising:

connection pads disposed on the rear surface and contacting the connection bumps; and connection openings respectively exposing the connection pads on the rear surface, wherein the connection bumps are electrically connected to the redistribution layer through the connection openings.

11. The semiconductor package of claim 10, wherein each of the connection pads has a width greater than a width of each of the rear pads in a first direction.

12. The semiconductor package of claim 10, wherein the connection pads are disposed at a different level from the rear pads.

13. The semiconductor package of claim 1, wherein the rear pads are disposed in rows and columns, and have the same size as each other.

14. The semiconductor package of claim 1, wherein the passive device comprises a capacitor.

15. The semiconductor package of claim 1, wherein the passive device has the maximum height smaller than the maximum height of the connection bumps in a direction perpendicular to the rear surface.

16. The semiconductor package of claim 1, further comprising:

an encapsulant sealing at least a portion of the semiconductor chip on the front protective layer.

17. A semiconductor package, comprising:

a package substrate including:

a base substrate including a redistribution layer, a plurality of pads disposed on a first surface of the base substrate and electrically connected to the redistribution layer, and a protective layer having a mounting region in which first openings respectively exposing first pads among the plurality of pads and a second opening exposing second pads among the plurality of pads and a portion of the first surface are disposed on the first surface of the base substrate;

a passive device disposed on the mounting region of the protective layer and electrically connected to the plurality of pads through the first openings and the second opening; and a sealing material covering a portion of the passive device and extending into the second opening, wherein four first openings among the first openings are respectively disposed adjacent to respective corners of the mounting region, wherein the second opening is disposed to divide the four first openings into at least two groups, wherein the first openings and the second opening are included in the mounting region and wherein the first pads corresponding to the first openings and the second pads corresponding to the second opening are disposed in the mounting region.

18. The semiconductor package of claim 17, wherein the passive device comprises a silicon (Si) capacitor.

19. A package substrate, comprising:

a base substrate including a plurality of insulating layers and redistribution layers disposed in the plurality of insulating layers, and having a front surface and a rear surface opposite to the front surface;

front pads disposed on the front surface and electrically connected to the redistribution layers;

rear pads disposed on the rear surface and electrically connected to the redistribution layers;

a front protective layer having front openings respectively exposing the front pads on the front surface; and a rear protective layer having a mounting region in which first rear openings respectively exposing first rear pads among the rear pads and a second rear opening exposing second rear pads among the rear pads and a portion of the rear surface are disposed on the rear surface, wherein four rear openings among the first rear openings are respectively disposed adjacent to respective corners of the mounting region, wherein the second rear opening is disposed to divide the four rear openings into at least two groups, wherein the first rear openings and the second rear opening are included in the mounting region, and wherein the first rear pads corresponding to the first rear openings and the second rear pads corresponding to the second rear opening are disposed in the mounting region.

20. The package substrate of claim 19, wherein the uppermost insulating layer among the plurality of insulating layers provides the front surface, and wherein the lowermost insulating layer among the plurality of insulating layers provides the rear surface.

* * * * *